United States Patent [19]
Carpenter et al.

[11] 3,952,288
[45] Apr. 20, 1976

[54] MULTIFREQUENCY LINEAR FILTER NETWORKS WITH ACTIVE ELEMENTS

[75] Inventors: Charles Howe Carpenter, Belmont; Thomas Raymond Stodolski, Cambridge, both of Mass.

[73] Assignee: Bell & Howell Company, Chicago, Ill.

[22] Filed: Sept. 30, 1974

[21] Appl. No.: 510,787

[52] U.S. Cl............................. 340/171 R; 340/311; 340/171 PF
[51] Int. Cl.² ........................................ H04Q 11/02
[58] Field of Search...... 340/311, 312, 313, 171 PF; 333/76; 328/167; 307/295

[56] References Cited
UNITED STATES PATENTS

| | | | |
|---|---|---|---|
| 3,098,220 | 7/1963 | De Graaf | 340/311 |
| 3,629,837 | 12/1971 | Fraunfelder | 340/171 PF |

*Primary Examiner*—Harold I. Pitts
*Attorney, Agent, or Firm*—Alfred H. Rosen; Frank A. Steinhilper

[57] ABSTRACT

A linear filter network incorporating active elements, and which obeys the relation $f_t \propto \sqrt{G_1 G_2}$, where $f_t$ is the band-pass center frequency of the network; and $G_1$ and $G_2$ are the conductance values of certain network circuit elements, has its transfer function for bandpass output controlled by a group of switchable conductances ($G_1 G_2$) in a digitally-controllable switching system that reduces the number of conductances required to achieve a given number of discrete passbands all having the same, or constant, bandwidth. A network that is switchable among 10 or more frequencies is used in a tone-responsive paging system for response to one or more of a series of calling tones or frequencies that follow each other in equal frequency intervals or steps "$\Delta f$" chosen so that for a series of "n" steps no tone in the series is harmonically related to any of the others.

11 Claims, 3 Drawing Figures

3,952,288

MULTIFREQUENCY LINEAR FILTER NETWORKS WITH ACTIVE ELEMENTS

BACKGROUND OF THE INVENTION

In the art of paging persons by means of portable radio receivers carried on the person that are responsive to an assigned carrier frequency, it is known to modulate the carrier with a sequence of calling frequencies, or "tones", for the purpose of signalling to subscribers with unique combinations of tones, for example, to address a particular subscriber, or to broadcast a particular message. A known two-tone paging system uses two tones selected in a coded sequence from an array of 70 available tones that are spaced a constant percentage apart from each other in frequency. This system affords 4,900 possible calling combinations, (that is, $70^2 = 4,900$), some of which may not be useful. A known five-tone system uses five tones selected from an array of 11 available tones, to provide 100,000 possible calling combinations of paging tones on a single carrier frequency. In such a system, five tones are sent out (i.e.: modulate the carrier) in a coded sequence, but the number of tones used in a given coded sequence is not critical. In any system, each individual receiver is responsive to a selected one or few of all the possible useful codes. The present invention is described in connection with a multi-tone signalling system, to illustrate a presently-preferred embodiment of it as applicable to paging systems using space-transmitted (radio) wave energy, as well as wired paging systems in which the receivers may be in fixed locations.

In a five tone paging system, it is known to use 10 or more tone-frequencies which are each separated from the adjacent tones by a constant frequency difference, $\Delta f$. This use of constant $\Delta f$ yields tones that follow each other in equal steps, $n\Delta f$, where $n$ is an integer. In practice, the equal steps are related to a particular base or starting tone frequency, $f_o$, such as 459Hz. Thus, if $f_o = $ 459Hz, and $\Delta f = $ 141Hz, the following series of tone-frequencies will result ("Hz" being omitted: 459, 600, 741, 882, 1023, 1164, 1305, 1446, 1587, 1728, 1869, etc. None of these frequencies is harmonically related to any of the others. In a given five-tone page, each tone lasts 33 milliseconds, and there is a 35 millisecond gap between pages, resulting in $(5 \times 33)+35 = 200$ milliseconds for a complete page. Such a 5-tone paging system allows five pages per second.

In order to detect tone signals in an observation time interval independent of the tone frequency, it is known also to use a tone filter which has the same rise time for every tone in the system. This property of constant rise time with respect to frequency is a property of the constant bandwidth filter. The combination of constant $\Delta f$, with constant bandwidth in the tone filters, provides a multi-tone paging system which makes economical use of time. Such a system has also the property that the Q of the tone filter changes with respect to tone frequency, thereby enabling the adjacent tone rejection to be maintained relatively fixed. With fixed adjacent tone rejection, the adjacent bands (in the tone filter) can be evenly spaced (i.e.: $\Delta f = $ a constant).

The requirement for a constant bandwidth filter is satisfied by a filter known as the "Biquad" Active Filter, which is described in articles by Lee C. Thomas in IEEE Transactions on Circuit Theory, Vol. CT-18, No. 3, May, 1971, pages 350 to 361. The articles are entitled "The Biquad Part I — Some Practical Design Considerations" (pp. 350–357); and "The Biquad: Part II — A multipurpose Active Filtering System" (pp. 358–361). FIG. 1 of the latter article (Part II) shows a structure that realizes a general biquadratic voltage transfer function the coefficients of which are functions of resistance values.

It is known to use a network of "$2n$" switchable resistors in an Active Filter to achieve "$n$" tones from the filter. The resistors required are of a high-precision type. Since in practice each resistor is switched with a field-effect transistor (FET) or equivalent semiconductor device, such a use requires that "$2n$" switching devices also be present. For a 16-tone filter (i.e.: a filter having 16 pass-bands) according to the known prior art, therefore, it is required to provide 32 high precision resistors and 32 FET switching devices.

GENERAL NATURE OF THE INVENTION

In accordance with the present invention, a network of resistors is arrayed in a binary pattern which reduces the number of precision resistors and switches needed to obtain a given number of arbitrary voltage transfer functions for bandpass output from a linear filter network incorporating active elements. The switching means are digitally controllable, to effect use of some of the resistors in the array in combination with others, while preserving the constant $\Delta f$ which has been found useful in the prior art. In comparison with the prior-art switching mechanisms that require (for example) eleven pairs of resistors and switches to achieve eleven tone frequencies, the present invention requires only five pairs of resistors and four pairs of switches to achieve the same 11 tone frequencies from a given switchable tone-frequency filter. Expressed more generally, where the prior art requires "$2n$" switchable resistors and switches to achieve "$n$" tones, the present invention requires only $2(m+1)$ resistors and $2m$ switches, where $2^m \geq n$ defines "$m$", to achieve the same result. Thus, for 16 tones, $n = 16$ and $m = 4$. For 11 tones $n = 11$, but since $2^3 = 8$, it is preferable to set $m = 4$.

DETAILED DESCRIPTION OF THE DRAWINGS

Figure 1:
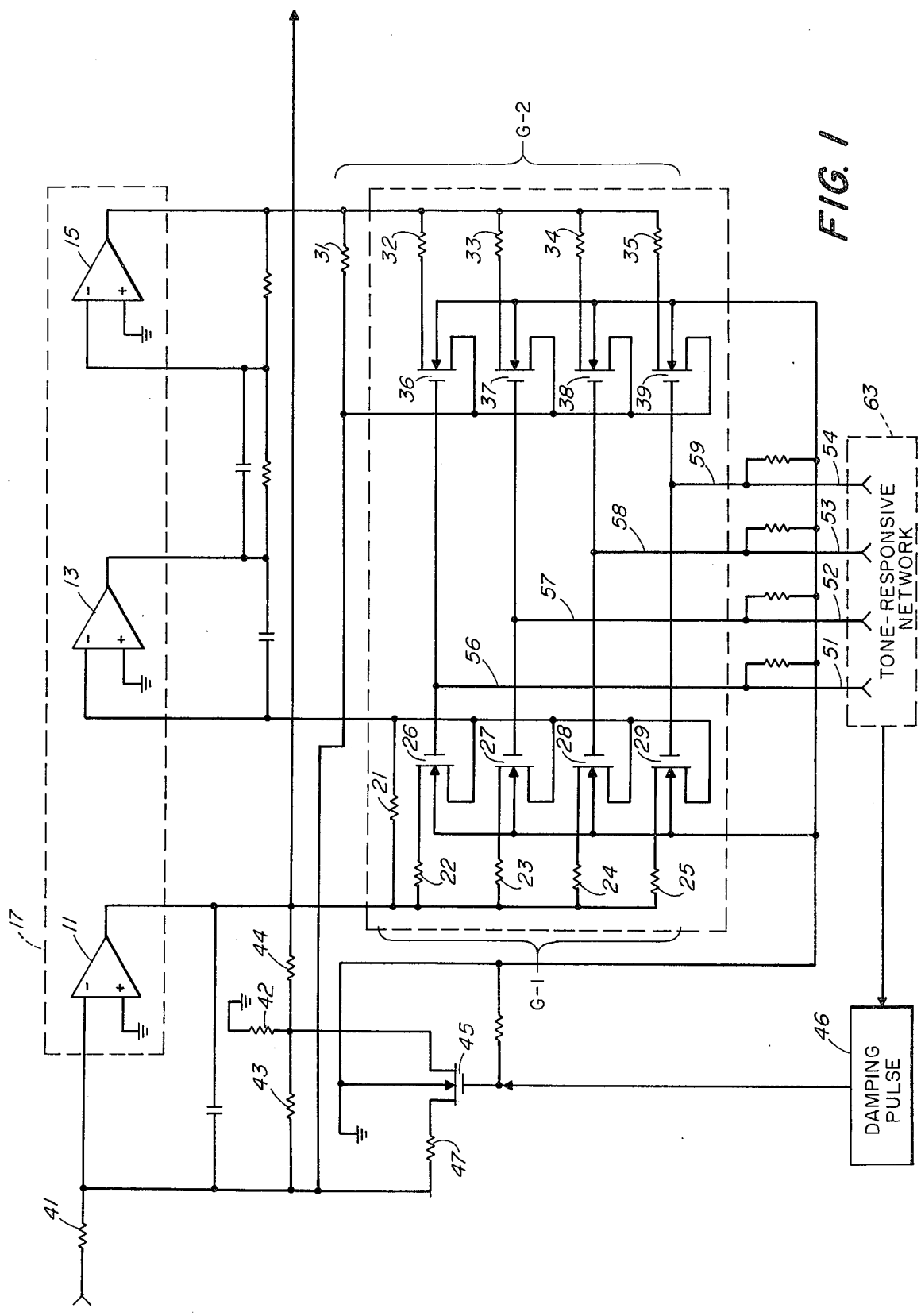
FIG. 1 is a schematic circuit of a multifrequency filter according to the invention.

FIG. 1 shows a filter network that is substantially similar to the "Biquad Circuit" illustrated at FIG. 1 in each of the Thomas articles mentioned above, with a provision added according to the invention for varying the values of Thomas' resistors R2 and R3 in a unique digitally-controllable way so the network is switchable among a series of discrete pass-bands centered at frequencies that follow each other in substantially equal frequency intervals or steps. Amplifiers 11, 13 and 15 within the dashed-line box 17 correspond to Thomas' amplifiers $K_1$, $K_2$ and $K_3$. Resistor 21 corresponds to Thomas' interstage resistor $R_2$, and resistor 31 corresponds to Thomas' resistor $R_3$ in the main feedback loop. Resistor 41 corresponds to Thomas' input resistor $R_4$. Resistors 43 and 44 in series, with resistor 42 from their junction to ground, correspond to Thomas' damping resistor $R_1$. A switch 45 is added to shunt resistor 47 across resistor 43, for a damping purpose that will be described below.

Four resistors 22, 23, 24 and 25 in a first resistor net $G_1$ are each connected in a shunt branch across resistor 21 through a respective semiconductor switch 26, 27, 28 and 29. Four additional resistors 32, 33, 34 and 35 in a second resistor net $G_2$ are each connected in a shunt branch across resistor 31 through a respective semiconductor switch 36, 37, 38 and 39. The switches may conveniently be field-effect transistors (FET). The control electrodes of the first FET's 26, 36 in each net are connected together and via a line 56 to a first frequency control terminal 51. The control electrodes of the second FET's 27, 37 in each net are connected together and via a line 57 to a second frequency control terminal 52. The control electrodes of the third FET's 28, 38 in each net are connected together and via a line 58 to a third frequency control terminal 53, and the control electrodes of the fourth FET's 29, 39 in each net are connected together and via a line 59 to a fourth frequency control terminal 54. During operation of the filter network, a control voltage which can have one of two possible levels (0,1) is applied to each control terminal, so that each switch can be either open or closed depending on the control voltage applied to the relevant control terminal.

Figure 2:
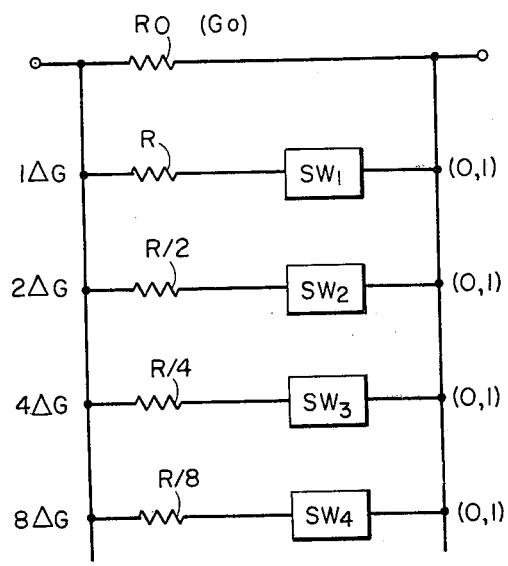
FIG. 2 is a schematic circuit of a resistor net in FIG. 1.

In FIG. 2, resistors R, R/2, R/4 and R/8 with their respective associated switches SW1, SW2, SW3 and SW4 represent either one of the resistor nets $G_1$ and $G_2$, in which resistor $R_0$ represents the corresponding base-frequency circuit resistor 21 or 31. The switches can be open or closed, as is represented by the symbols (0,1) adjacent each switch. Assuming that the filter network is to be used in a tone-responsive signalling system using five tones, in which the base or starting tone frequency $f_0$ is 459Hz, then $R_0$ has a value of resistance (or conductance) which will establish the pass-band center frequency at $f_0$, if all switches are open. Conveniently, for design purposes, this value is chosen to be the same for resistors 21 and 31. In terms of conductances, the tone frequency $f_t$ is given by the relation $$f_t \propto \sqrt{G_1 G_2},$$

and if we set $G_1 = G_2 = G$,
then $f_t \propto G$.
Now, if $G_0$ is the conductance of $R_0$, the total conductance $G_t$ necessary to yield a selected tone frequency $f_0 + n\Delta f$ is given by the relation $$G_t = G_0 + n\Delta G$$

Where $G_0$ is independent of the value of $G$, and $\Delta G$ is a constant.

Thus, to increase the tone frequency in equal steps (of e.g.: 141 Hz) from a base frequency (e.g.: 459Hz) it is only necessary to add conductance in identical equal steps in each resistor net $G_1$ and $G_2$. In the branches shunting $R_0$, the largest resistor R adds conductance $1 \times \Delta G$ when its switch SW1 is closed, indicated at the left-hand end of the resistor. The next smaller resistor R/2 adds conductance $2\Delta G$ when its switch SW2 is closed. The next smaller resistor R/4 adds conductance $4\Delta G$ when its switch SW3 is closed, and the smallest resistor R/8 adds conductance $8\Delta G$ when its switch SW4 is closed. The conductance value $3\Delta G$ can be added to $G_0$ by closing switches SW1 and SW2, simultaneously. The conductance value $5\Delta G$ can be added to $G_0$ by closing switches SW1 and SW3 simultaneously. A chart showing the positions of the four switches for adding $\Delta G$ to $G_0$ in integral increment from 0 to 10, with resulting value of $f_0 + n\Delta f$, is as follows:

CHART I

| $G_0 + \Delta G_x$ | $f_0 + n\Delta f$ Hz | SW4 | SW3 | SW2 | SW1 |
|---|---|---|---|---|---|
| 0 | 459 | 0 | 0 | 0 | 0 |
| 1 | 600 | 0 | 0 | 0 | 1 |
| 2 | 741 | 0 | 0 | 1 | 0 |
| 3 | 882 | 0 | 0 | 1 | 1 |
| 4 | 1023 | 0 | 1 | 0 | 0 |
| 5 | 1164 | 0 | 1 | 0 | 1 |
| 6 | 1305 | 0 | 1 | 1 | 0 |
| 7 | 1446 | 0 | 1 | 1 | 1 |
| 8 | 1587 | 1 | 0 | 0 | 0 |
| 9 | 1728 | 1 | 0 | 0 | 1 |
| 10 | 1869 | 1 | 0 | 1 | 0 |

As is apparent, 11 tones are possible using five resistors and only four switches in each resistor net. As can be seen, the binary combinations possible will permit up to 16 tones to be selected.

Figure 3:
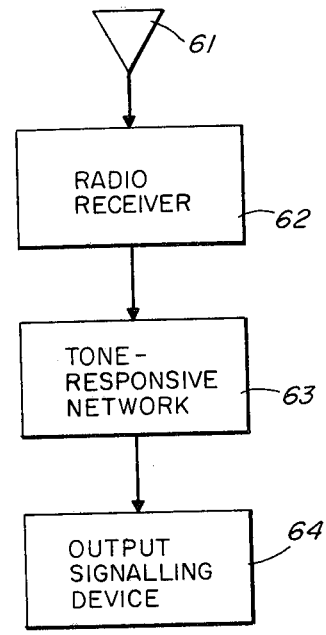
FIG. 3 is a block diagram of a code responsive radio receiver in which the invention is useful.

FIG. 3 represents a code-responsive radio receiver, such as a paging receiver, in which the present invention is useful. An antenna 61 feeds acquired signals to a radio receiver 62 which in turn applies corresponding signals to a tone-responsive network 63 incorporating the invention. In a practical embodiment, the network 63 may include a read-only memory (ROM) array, having connections to each of the control terminals 51–54, respectively, for setting the four switches SW1–SW4, inclusive, in a selected one of the states shown in Chart I, to set the filter of FIG. 1 to one tone $(f_0 + n\Delta f)$, and then in another state to select another tone $(f_0 + n\Delta f)$, and so forth up to five tones in a predetermined tone sequence. If an incoming radio signal bears corresponding tone-modulation in the same sequence, the tone-responsive network will respond to the "match" and will so indicate by activating an output signalling device 64, which may provide its own unique signal or signals.

Because the length of each tone is only 33 milliseconds, there is in practice not sufficient time for the tone filter to ring down before it begins to look for the next tone in a code sequence. The switch 45 is closed by a damping signal applied to terminal 46 from the tone-responsive network 63 to connect a resistor 47 across a damping resistor 43, and thereby to increase the bandwidth of the filter about ten-fold (e.g.: from 20 Hz to about 250 Hz). The associated decoding logic components (not shown) will supply a pulse of suitable length (e.g.: approximately 4 milliseconds long) for damping of one tone in the filter prior to setting the filter pass band for the next tone.

Although, as has been mentioned, resistors 21 and 31 can have the same value of resistance ($R_0$) or conductance ($G_0$), and it is convenient for design purposes to set $G_1 = G_2$, the invention is not limited to that design choice, and one can employ the invention in a filter, or in a signalling system, in which $G_1$ is not equal to $G_2$. If the resistance of resistor 21 is, for example, 20% larger than that of resistor 31, then the same ratio should hold between resistors 22 and 32; 23 and 33; 24 and 34; and 25 and 35.

The expression $2^m \geq n$ means $2^m$ is equal to or greater than $n$.

We claim:

1. In a bandpass active filter circuit which has its transfer function for bandpass output controlled by a conductance magnitude, a conductance net comprising a base resistor having a conductance magnitude for setting the pass band of said filter at a base center-frequency $f_o$, means for setting said pass band to one of a plurality "$n$" center frequencies $f_o + n\Delta f$ comprising a plurality "$m$" of shunt resistors each connected in series with a unique two-state switch in a shunt branch across said base resistor, said two states being substantially an open state and a closed state, the conductance magnitudes of said shunt resistors increasing from the smallest to the largest conductance by $2^0, 2^1, \ldots 2^m$ where "$m$" is an integer smaller than "$n$", and $2^m \geq n$, and means to establish a pattern of simultaneous states of said switches for setting the pass band of said filter at a desired center frequency $f_o + n\Delta f$.

2. A filter according to claim 1 including means to establish a temporal series of said patterns of states, for setting said passband at a temporal series of desired center frequencies.

3. In a bandpass active filter circuit which has its transfer function for bandpass output controlled by the respective magnitudes of two individual conductances each located in a part of the circuit where it performs a function that is different from the function performed by the other, two substantially similar conductance nets located one at each of said locations, each said net comprising a base resistor having a conductance magnitude for setting the pass band of said filter at a base center-frequency $f_o$, means for setting said pass band to one of a plurality "$n$" center frequencies $f_o + n\Delta f$ comprising a plurality "$m$" of shunt resistors each connected in series with a unique two-state switch in a shunt branch across said base resistor, said two states being substantially an open state and a closed state, the conductance magnitudes of said shunt resistors increasing from the smallest to the largest by $2^0, 2^1 \ldots 2^m$ where "$m$" is an integer smaller than "$n$" and $2^m \geq n$, and means to establish a like pattern of simultaneous states of said switches in each conductance net, for setting the pass band of said filter at a desired center frequency $f_o + n\Delta f$.

4. A filter according to claim 3 including means to connect together the two switches in the corresponding branches of each of said nets for setting each such pair of corresponding switches simultaneously in the same state.

5. A filter according to claim 3 including means to establish a like temporal series of said patterns in each conductance net, for setting said pass band at a temporal series of desired center frequencies.

6. A filter according to claim 4 in which each of said switches is a semiconductor device the state of which can be changed by changing a property of a control voltage applied to an electrode thereof, and said electrodes of each such pair are connected together to a source of control voltage.

7. In a multi-tone signalling system for receiving signals bearing tone-modulation in a coded sequence, a band pass active filter which has its transfer function for band pass output controlled by a conductance magnitude, means to supply such received signals to said filter, said filter including at least one conductance net comprising a base resistor having a conductance magnitude for setting the pass band of said filter at a base center-frequency $f_o$, means for setting said pass band to one of a plurality "$n$" center frequencies $f_o + n\Delta f$ comprising a plurality "$m$" of shunt resistors each connected in series with a unique two-state switch in a shunt branch across said base resistor, said two states being substantially an open state and a closed state, the conductance magnitudes of said shunt resistors increasing from the smallest to the largest conductance by $2^0, 2^1, \ldots, 2^m$ where "$m$" is an integer smaller than "$n$" and $2^m \geq n$, means to establish a pattern of states of said switches for setting the pass-band of said filter at desired center frequency $f_o + n\Delta f$, and means to control said pattern-establishing means for setting said passband at a temporal series of desired center frequencies which matches said coded sequence of tone-modulations.

8. A signalling system according to claim 7 including an output-signal means, and means responsive to the condition in which said coded sequence of tone modulation on a received signal matches the temporal series of bandpass center frequencies that is set on said filter for activating said output signal means.

9. A filter according to claim 1 wherein $\Delta f$ is a constant.

10. A filter according to claim 3 wherein $\Delta f$ is a constant.

11. A system according to claim 7 wherein $\Delta f$ is a constant.

* * * * *